US008400786B2

(12) United States Patent
Nishi

(10) Patent No.: US 8,400,786 B2

(45) Date of Patent: Mar. 19, 2013

(54) APPARATUS HAVING A SHIELD CONDUCTOR PLACED OUTSIDE OF THE CIRCUIT BOARD

(75) Inventor: Naoto Nishi, Kanagawa (JP)

(73) Assignee: Fuji Xerox Co., Ltd., Tokyo (JP)

( * ) Notice: Subject to any disclaimer, the term of this patent is extended or adjusted under 35 U.S.C. 154(b) by 133 days.

(21) Appl. No.: 12/974,045

(22) Filed: Dec. 21, 2010

(65) Prior Publication Data

US 2011/0317377 A1 Dec. 29, 2011

(51) Int. Cl.
*H05K 9/00* (2006.01)

(52) U.S. Cl. ........................................................ 361/818

(58) Field of Classification Search ........................ None
See application file for complete search history.

(56) References Cited

U.S. PATENT DOCUMENTS

| | | | | |
|---|---|---|---|---|
| 2002/0054376 | A1* | 5/2002 | Wada | 358/472 |
| 2009/0237907 | A1* | 9/2009 | Kunimoto et al. | 361/818 |
| 2009/0244437 | A1* | 10/2009 | Yamaguchi et al. | 349/60 |

FOREIGN PATENT DOCUMENTS

| | | |
|---|---|---|
| EP | 0 806 891 | 11/1997 |
| JP | 5-76094 | 10/1993 |
| JP | 10-56285 | 2/1998 |

* cited by examiner

*Primary Examiner* — Lisa Lea Edmonds
*Assistant Examiner* — Xanthia C Cunningham
(74) *Attorney, Agent, or Firm* — Sughrue Mion, PLLC

(57) ABSTRACT

An apparatus includes: a circuit board which is disposed in a main unit of the apparatus; a shielding conductor which is placed outside the circuit board as viewed from the apparatus main unit; a covering member which covers an outer side face of the apparatus main unit; and an electrically conductive member which is fixed to an inside of the covering member to cross an opening which exists between a main unit frame on which the circuit board is disposed, and the shielding conductor, one end portion of the electrically conductive member being connected to the shielding conductor, another end portion of the electrically conductive member being connected to a grounded frame of the apparatus main unit.

2 Claims, 15 Drawing Sheets

FIG. 13

| FIELD INTENSITY OF RADIATION NOISE | COUNTERMEASURE IS NOT TAKEN | COUNTERMEASURE IS TAKEN (REDUCTION OF OPENING AREA) |
|---|---|---|
| 3V/m | × | ○ |
| 4V/m | × | ○ |
| 5V/m | × | ○ |
| 6V/m | × | ○ |

○ : NORMAL OPERATION
× : MALFUNCTION OCCURS

APPARATUS HAVING A SHIELD CONDUCTOR PLACED OUTSIDE OF THE CIRCUIT BOARD

CROSS-REFERENCE TO RELATED APPLICATIONS

This application is based on and claims priority under 35 USC 119 from Japanese Patent Application No. 2010-145898 filed on Jun. 28, 2010.

BACKGROUND

1. Technical Field

The present invention relates to an apparatus.

2. Related Art

In an apparatus such as an image forming apparatus, conventionally, electric circuits such as a control circuit for controlling the image forming operation, and a high-voltage power supply circuit are attached to a main frame placed in the back side of the apparatus main unit, in a state where the electric circuits are housed in a metal-made box or surrounded by a metal plate. In an apparatus such as the image forming apparatus, the electric circuits which are housed in a metal-made box or surrounded by a metal plate are protected from electromagnetic wave noise by grounding the main frame of the apparatus main unit, and circuit boards such as printed circuit boards which are placed in the apparatus main unit and inside a metal-made box or a metal plate is protected from externally generated electromagnetic wave noise by the metal-made box or the metal plate.

SUMMARY

According to an aspect of the invention, there is provided an apparatus including: a circuit board which is disposed in a main unit of the apparatus; a shielding conductor which is placed outside the circuit board as viewed from the apparatus main unit; a covering member which covers an outer side face of the apparatus main unit; and an electrically conductive member which is fixed to an inside of the covering member to cross an opening which exists between a main unit frame on which the circuit board is disposed, and the shielding conductor, one end portion of the electrically conductive member being connected to the shielding conductor, another end portion of the electrically conductive member being connected to a grounded frame of the apparatus main unit.

BRIEF DESCRIPTION OF THE DRAWINGS

Exemplary embodiments of the present invention will be described in detail based on the following figures, wherein:

FIG. 13 is a table showing an experimental example;

DETAILED DESCRIPTION

Exemplary Embodiment 1

Figure 2:
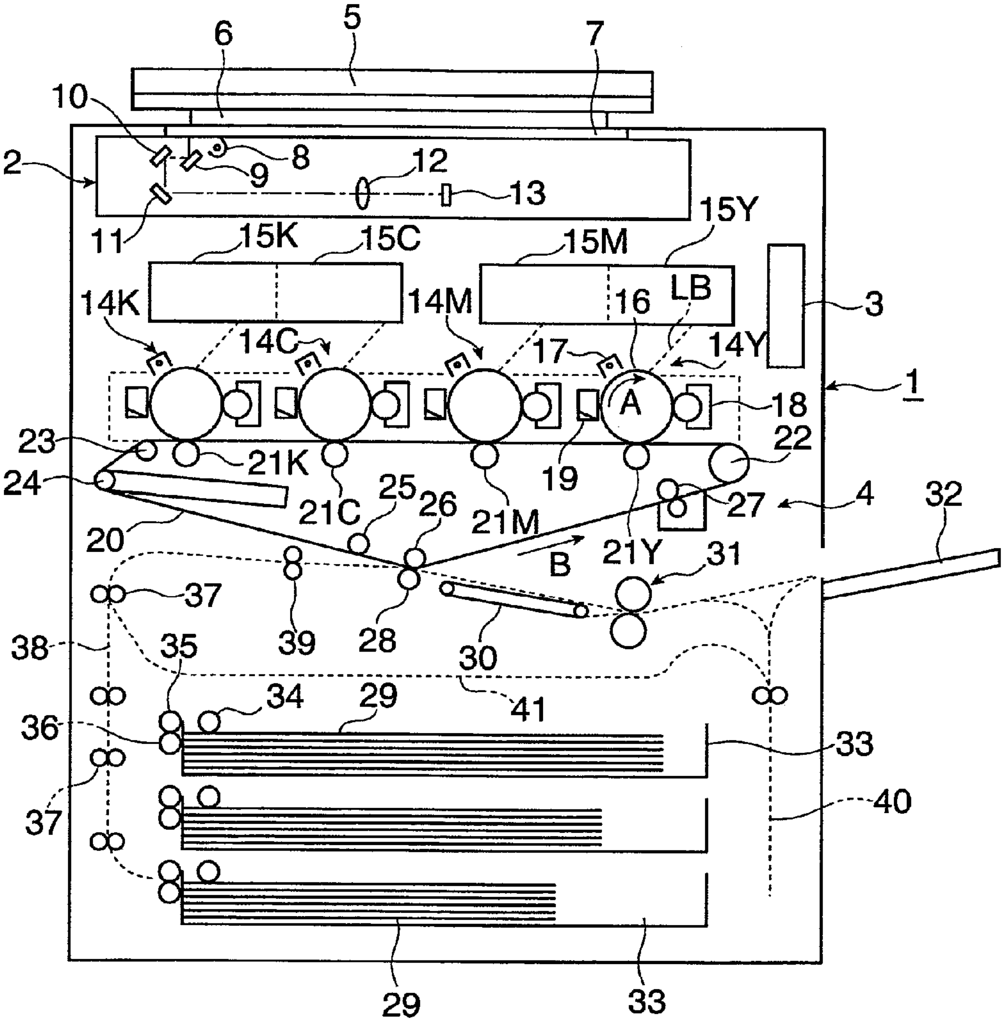
FIG. 2 is a diagram showing the image forming apparatus which is the apparatus of Exemplary embodiment 1 of the invention.

FIG. 2 is a diagram showing an electrophotographic image forming apparatus which is an apparatus of Exemplary embodiment 1 of the invention.

Referring to FIG. 2, 1 denotes the main unit of the image forming apparatus which is the apparatus main unit.

An image reading apparatus 2 which reads an image of an original 6 is placed in an upper portion of the image forming apparatus main unit (hereinafter, often referred to merely as "apparatus main unit") 1. In the apparatus main unit 1, an image processing device 3 which applies predetermined image processes on image data that are supplied from the image reading apparatus 2, a personal computer (not shown), and the like, or those that are sent through a telephone line, a LAN, and the like is placed. Also an image outputting device 4 which outputs an image based on the image data that have undergone the predetermined image processing in the image processing device 3 is placed in the apparatus main unit 1.

The image reading apparatus 2 includes a platen glass 7 on which, when a document cover 5 is opened, an original 6 can be placed, and is configured so that the original 6 placed on the platen glass 7 is illuminated by a light source 8, the light image reflected from the original 6 scan-exposes an image reading element 13 configured by a CCD or the like through a reduction scanning optical system configured by a full-rate mirror 9, half-rate mirrors 10, 11, and an imaging lens 12, and the image of the original 6 is read by the image reading element 13.

The image of the original 6 read by the image reading apparatus 2 is sent in the form of (for example, 8-bit) reflectance data of three colors such as red (R), green (G), and blue (B), to the image processing device 3. In the image processing device 3, predetermined image processes such as shading correction, position deviation correction, brightness/color spatial conversion, gamma conversion, frame deletion, and color/movement edition are applied on the reflectance data of the original 6, and the data are converted to image data of four colors of yellow (Y), magenta (M), cyan (C), and black (K).

In the apparatus main unit 1, four image forming units 14Y, 14M, 14C, 14K for yellow (Y), magenta (M), cyan (C), and black (K) are horizontally arranged in a parallel manner while forming constant intervals therebetween.

As shown in FIG. 2, basically, the four image forming units 14Y, 14M, 14C, 14K are configured in the same manner except the color of an image to be formed. Roughly, each of the image forming units is configured by: a photosensitive drum 16 functioning as an image carrier which is rotated in the direction of arrow A at a predetermined speed; a scorotron 17 for primary charging which uniformly charges the surface of the photosensitive drum 16; an image exposing device 15 which applies image exposure to the surface of the photosensitive drum 16 on the basis of image data corresponding to the each color to form an electrostatic latent image; a developing device 18 which develops the electrostatic latent image formed on the photosensitive drum 16 by a toner of the corresponding color; and a cleaning device 19 which removes a toner and like residuals remaining on the surface of the photosensitive drum 16.

As shown in FIG. 2, the image processing device 3 sequentially supplies image data of the respective colors to the image exposing devices 15Y, 15M, 15C, 15K of the image forming units 14Y, 14M, 14C, 14K for yellow (Y), magenta (M), cyan (C), and black (K), and the laser beams LB which are emitted from the image exposing devices 15Y, 15M, 15C, 15K in accordance with the image data scan-expose the surfaces of the corresponding photosensitive drums 16Y, 16M, 16C, 16K to form electrostatic latent images. The electrostatic latent images formed on the surfaces of the corresponding photosensitive drums 16Y, 16M, 16C, 16K are developed by the developing devices 18Y, 18M, 18C, 18K, as color toner images of yellow (Y), magenta (M), cyan (C), and black (K), respectively.

The color toner images of yellow (Y), magenta (M), cyan (C), and black (K) which are sequentially formed on the photosensitive drums 16Y, 16M, 16C, 16K of the image forming units 14Y, 14M, 14C, 14K are multiply transferred by primary transfer rolls 21Y, 21M, 21C, 21K onto an intermediate transfer belt 20 functioning as an endless belt-like intermediate transfer member which is placed below the image forming units 14Y, 14M, 14C, 14K, at respective primary transfer positions as shown in FIG. 2.

The intermediate transfer belt 20 is wound at a constant tension around a driving roll 22, a driven roll 23, a tensioning roll 24, a driven roll 25, a back-up roll 26, and a driven roll 27, and circularly driven at a predetermined moving speed in the direction of arrow B by the driving roll 22 which is rotatingly driven by a dedicated driving motor that has an excellent constant speed property, and that is not shown. An endless belt-like member produced by forming a film of a flexible synthetic resin such as polyimide or polyamide-imide into a belt-like shape may be used as the intermediate transfer belt 20.

The color toner images of yellow (Y), magenta (M), cyan (C), and black (K) which are multiply transferred onto the intermediate transfer belt 20 are collectively secondary-transferred at a secondary transfer position onto a recording sheet 29 functioning as a recording medium, by a secondary transfer roll 28. The recording sheet 29 onto which toner images corresponding to colors of images to be formed are transferred is conveyed to a fixing device 31 by a conveyor belt 30. The recording sheet 29 onto which the color toner images are transferred undergoes a fixing process by means of heat and pressure in the fixing device 31, and then discharged onto a discharge tray 32 disposed outside the apparatus main unit 1.

As shown in FIG. 2, as the recording sheet 29, a sheet of the desired size and quality is fed from a plurality of sheet feed trays 33 disposed in a lower portion of the apparatus main unit 1, in a one-by-one separated manner by a sheet feeding roll 34 and a pair of sheet separation rolls 35, 36, and once conveyed to a registration roll 39 through a sheet conveying path 38 in which a plurality of conveying rolls 37 are disposed. The recording sheet 29 which is fed from one of the sheet feed trays 33 is sent to the secondary transfer position of the intermediate transfer belt 20 by the registration roll 39 which is rotatingly driven at a predetermined timing.

The image forming apparatus is configured so that, in the case where images are to be formed on both faces of the recording sheet 29, the recording sheet 29 in which an image is formed on one face is not directly discharged onto the discharge tray 32, but the conveying path for the recording sheet 29 which has been passed through the fixing device 31 is switched to a reversing sheet conveying path 40 which is positioned in the lower side, and then the sheet is again conveyed to the secondary transfer position of the intermediate transfer belt 20 in a reversed state while being passed through a both-face sheet conveying path 41, thereby forming an image on the rear face of the recording sheet 29.

Figure 3:
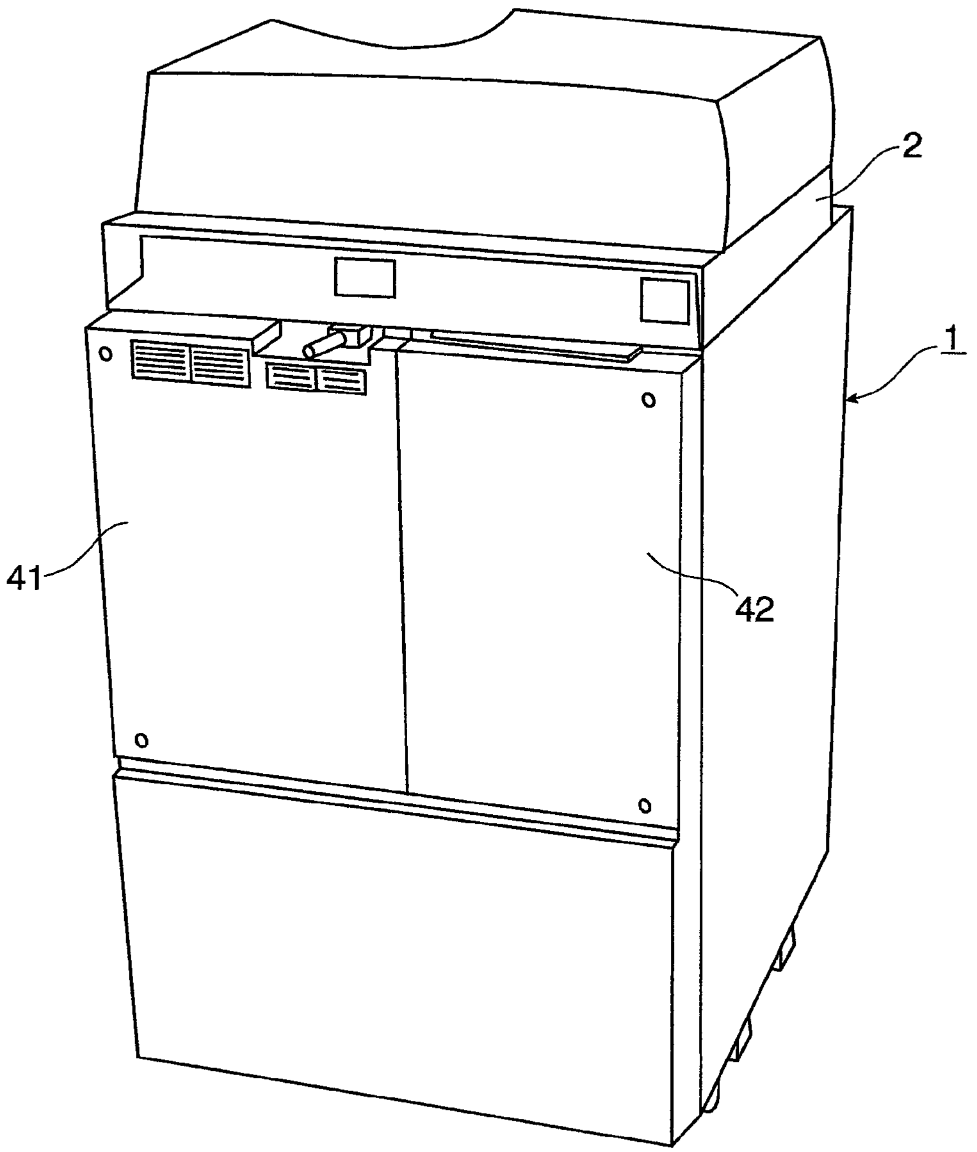
FIG. 3 is a rear perspective view showing the image forming apparatus which is the apparatus of Exemplary embodiment 1 of the invention.

As shown in FIG. 3, the back face side of the apparatus main unit 1 is covered by back covers 41, 42 which are two covering members that are formed by a synthetic resin or the like, and that are coupled to each other. In the apparatus main unit 1, onto the back face side from which the back covers 41, 42 are removed away, a first electric circuit board 43 which incorporates an MCU (Machine Control Unit) that controls the image forming operation of the image forming apparatus, a high-voltage power supply circuit, and the like, and a second electric circuit board 44 which incorporates a controller circuit that similarly controls the image forming operation of the image forming apparatus, and the like are attached. In order to shield the first and second electric circuit boards 43, 44 from the influence of externally generated electromagnetic wave noise, the electric circuit boards are housed in a box which is made of a metal such as stainless steel or aluminum, or the outer (one outer side of the apparatus main unit) surfaces of the first and second electric circuit boards 43, 44 are covered by a metal such as stainless steel or aluminum. In the illustrated exemplary embodiment, the first and second electric circuit boards 43, 44 are housed respectively in boxes 45, 46 which are made of a metal such as stainless steel or aluminum, in order to shield the electric circuit boards from the influence of externally generated electromagnetic wave noise.

Figure 5:
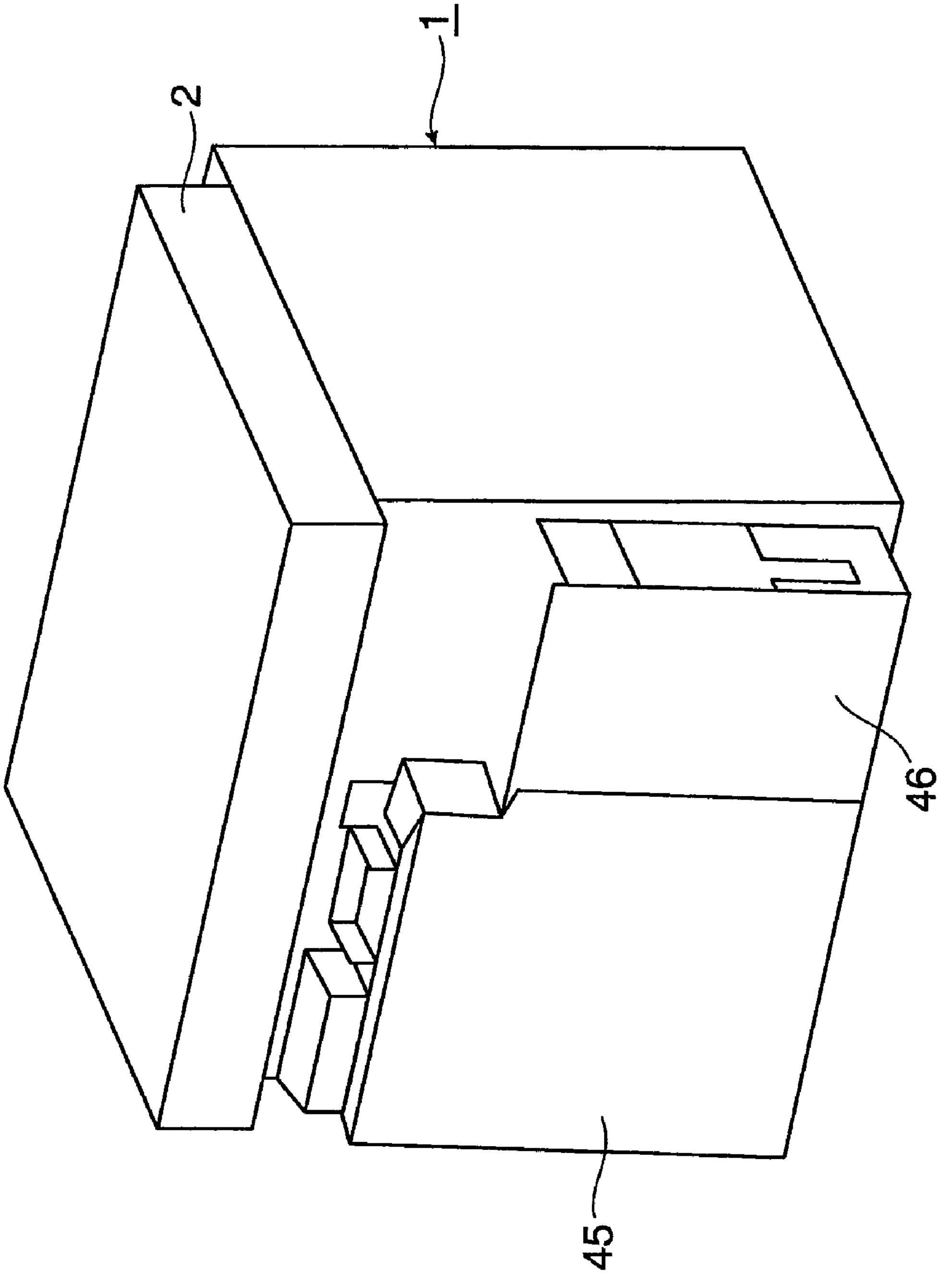
FIG. 5 is a rear perspective view showing a state where the back covers are removed away in the image forming apparatus which is the apparatus of Exemplary embodiment 1 of the invention.
Figure 6:
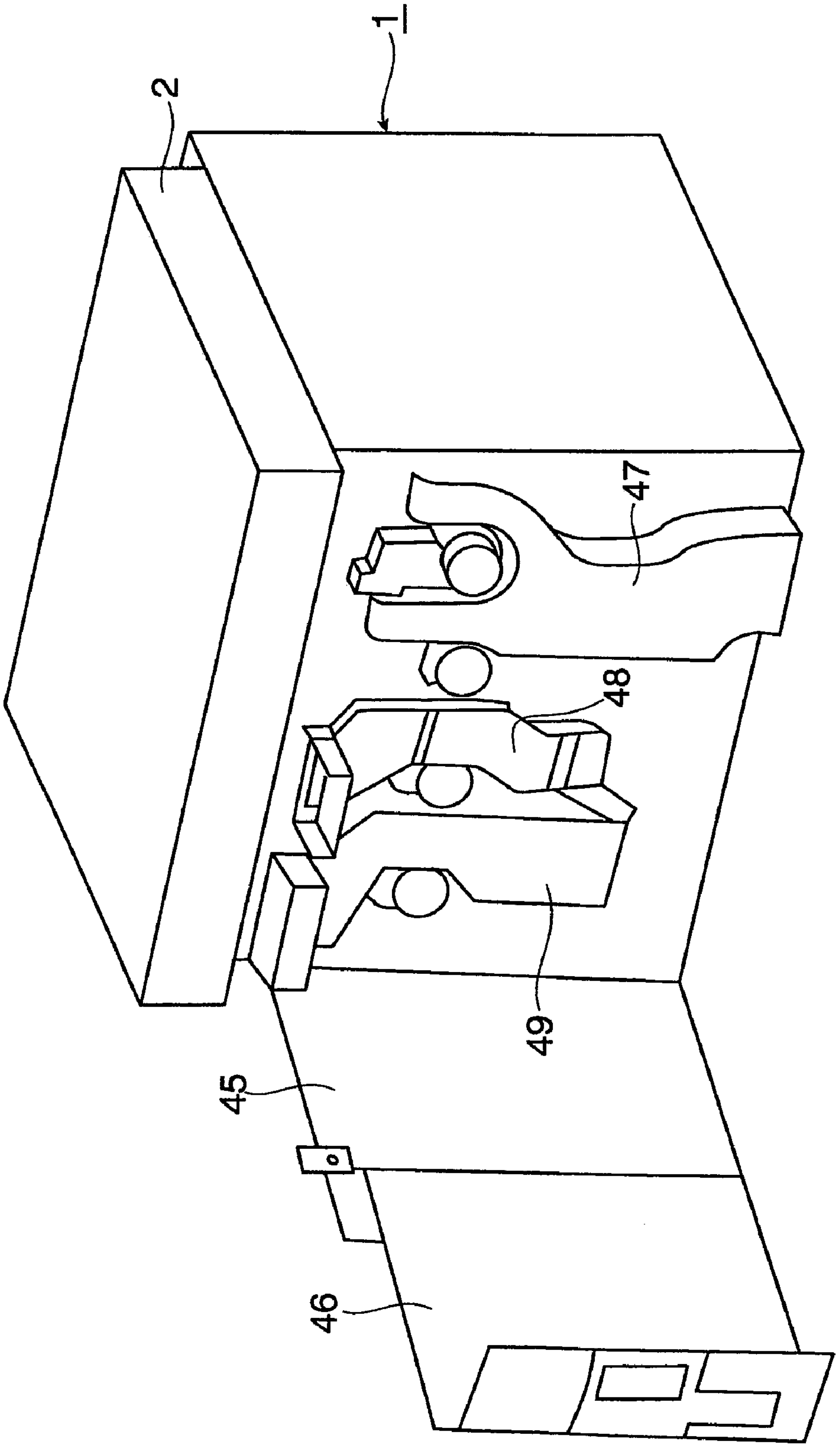
FIG. 6 is a view showing a state where metal-made boxes are opened.

As shown in FIGS. 5 and 6, the metal-made boxes 45, 46 which house the first and second electric circuit boards 43, 44 are openably attached to the apparatus main unit 1 through a hinge member (not shown) which is disposed in a left end portion of the first electric circuit board 43, in order to facilitate maintenance and the like of the apparatus main unit 1.

Figure 4:
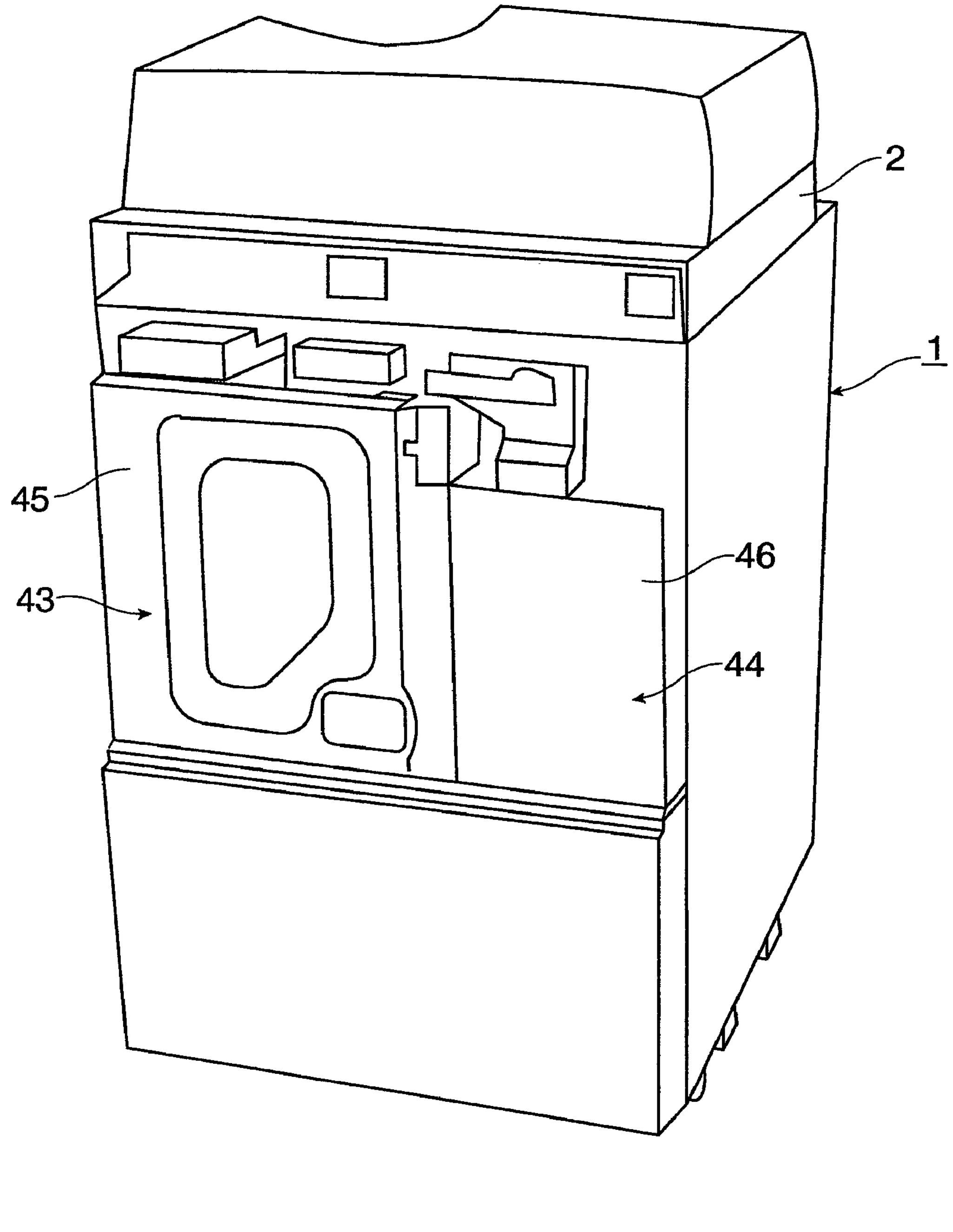
FIG. 4 is a rear perspective view showing a state where back covers are removed away in the image forming apparatus which is the apparatus of Exemplary embodiment 1 of the invention.

As shown in FIG. 4, the metal-made boxes 45, 46 are fixed to a main frame (not shown) of the apparatus main unit 1 by means of screwing or the like, and grounded through the main frame which is grounded by being connected to the ground.

Figure 7:
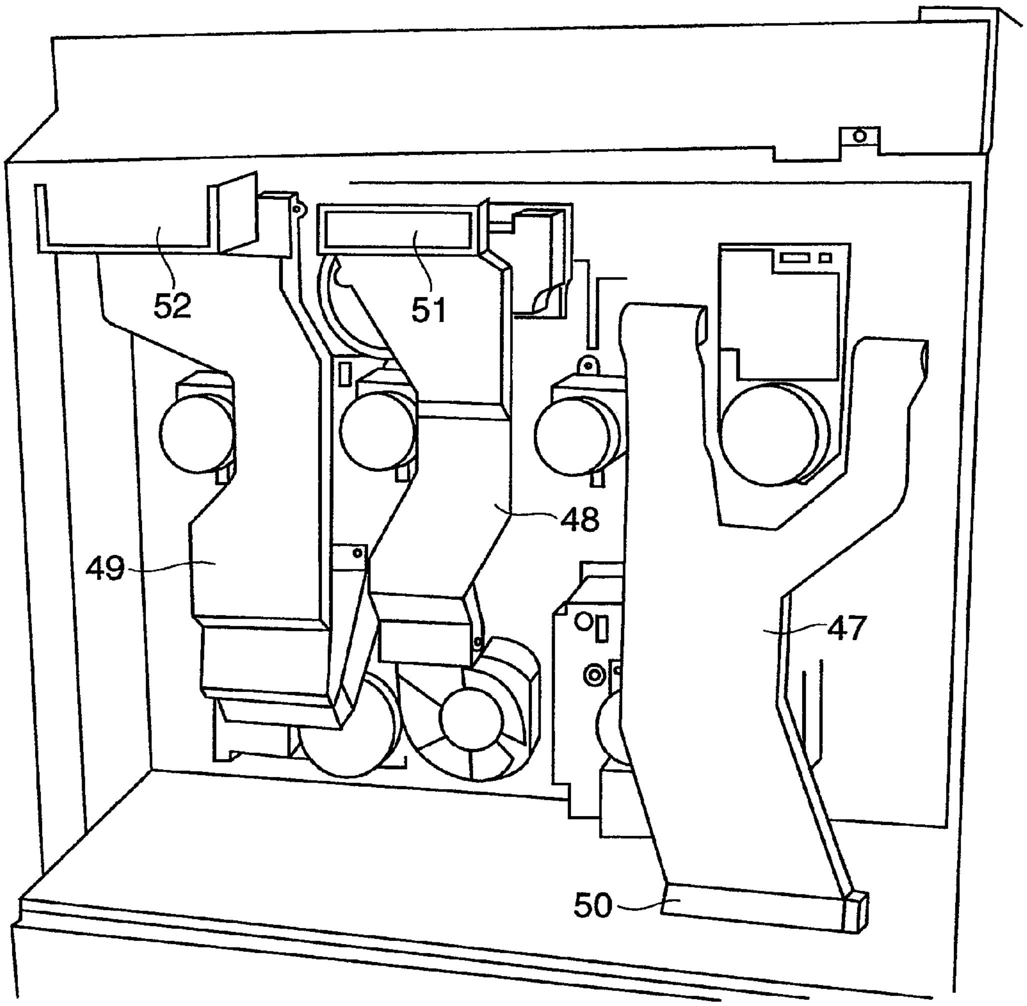
FIG. 7 is a view showing a state where the metal-made boxes are opened.

In the interior of the apparatus main unit 1 which is exposed by opening the metal-made boxes 45, 46, as shown in FIG. 7, an exhaust duct 47 for ejecting toners and discharge products suspended in the vicinities of primary charging scorotrons 17 of the image forming units 14Y, 14M, 14C, 14K for yellow (Y), magenta (M), cyan (C), and black (K), to the outside of the apparatus, a suction duct 48 through which air is sucked from the conveyor belt 30 to allow the recording sheet 29 to be conveyed while being sucked, and an exhaust duct 49 for sucking heated air which is in the periphery of the fixing device 31 to discharge the air to the outside are disposed.

As shown in FIG. 7, an exhaust port 50 of the exhaust duct 47 is opened toward the bottom face of the apparatus main unit 1, and an exhaust port 51 of the suction duct 48 and an exhaust port 52 of the exhaust duct 49 are opened toward the back face side in an upper portion of the back face of the apparatus main unit 1.

Figure 8:
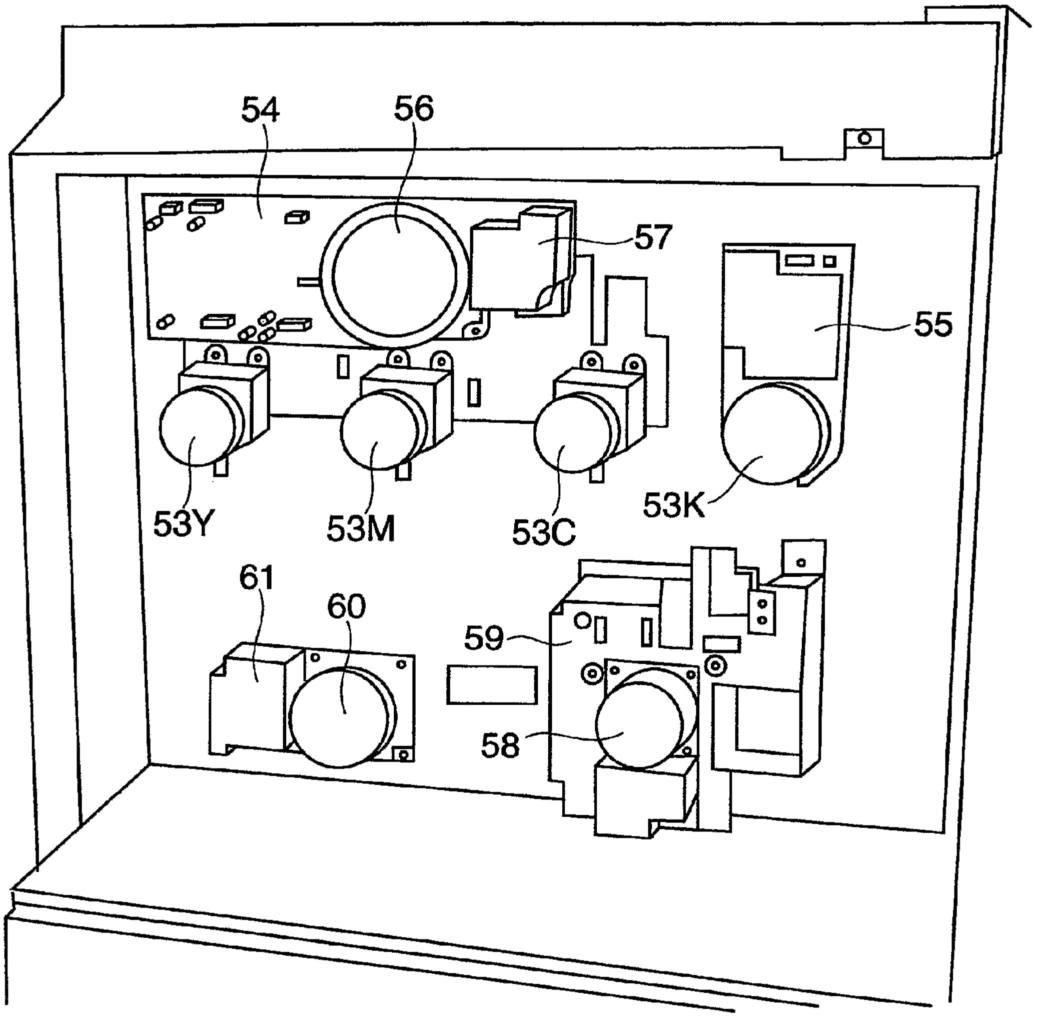
FIG. 8 is a view showing a state where ducts are removed away.
Figure 9:
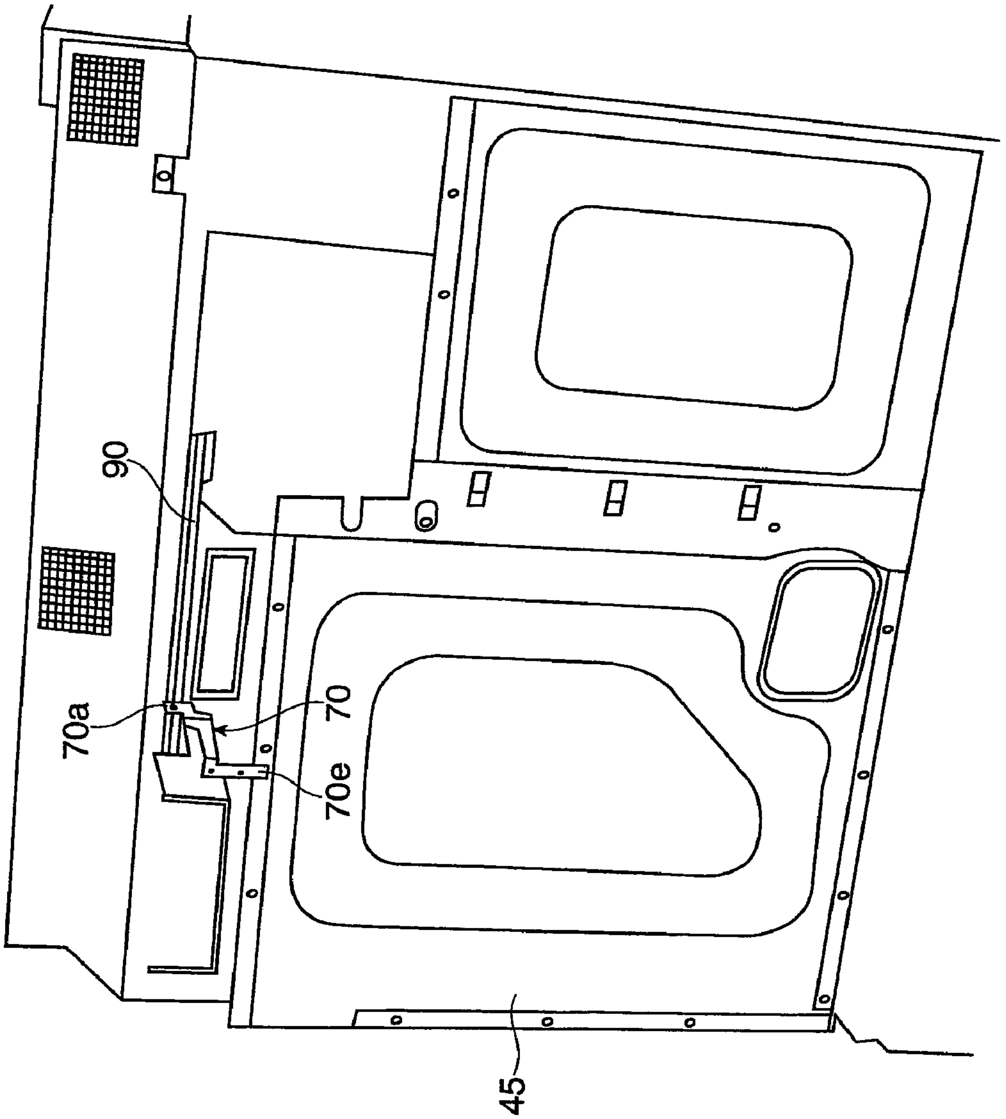
FIG. 9 is a rear perspective view showing a state where the back covers are removed away in the image forming apparatus which is the apparatus of Exemplary embodiment 1 of the invention.

In the apparatus main unit 1, as shown in FIG. 8, driving motors 53Y, 53M, 53C, 53K which rotate respectively the photosensitive drums 16Y, 16M, 16C, 16K of the image forming units 14Y, 14M, 14C, 14K for yellow (Y), magenta (M), cyan (C), and black (K) are placed inside the exhaust duct 47, the suction duct 48, and the exhaust duct 49. Among the driving motors 53Y, 53M, 53C, 53K, the driving motor 53K for black (K) is larger than the other motors or the color driving motors 53Y, 53M, 53C for yellow (Y), magenta (M), and cyan (C).

A first control board 54 configured by a motor control printed circuit board which is a to-be-protected circuit board that is common to the color driving motors 53Y, 53M, 53C for yellow (Y), magenta (M), and cyan (C) is attached to the driving motors 53Y, 53M, 53C for the three colors. A second control board 55 configured by a motor control printed circuit board which is a to-be-protected circuit board that is dedicated to the driving motor 53K for black (K) is attached to the driving motor 53K.

On the other hand, a large driving motor 56 which drives the developing devices 18 and cleaning devices 19 of the image forming units 14Y, 14M, 14C, 14K for yellow (Y), magenta (M), cyan (C), and black (K) is attached above the color driving motors 53Y, 53M, 53C. A third control board 57 configured by a control printed circuit board which is a to-be-protected circuit board is attached to the driving motor 56.

In the apparatus main unit 1, as shown in FIG. 8, a driving motor 58 which drives the secondary transfer roll 28, a waste toner recovery auger, and a developing roll for black (K) is placed, and a fourth control board 59 configured by a control printed circuit board which is a to-be-protected circuit board for controlling the driving motor 58 is attached.

In the apparatus main unit 1, as shown in FIG. 8, a driving motor 60 which drives the fixing device 31 is placed, and a fifth control board 61 configured by a control printed circuit board which is a to-be-protected circuit board for controlling the driving motor 60 is attached.

In the image forming apparatus of the exemplary embodiment, as shown in FIGS. 7 and 8, the exhaust duct 47, the suction duct 48, and the exhaust duct 49 are placed on the back face side of the first to fifth control boards 54, 55, 57, 59, 61 which are to-be-protected circuit boards, and the metal-made boxes 45, 46 housing the first and second electric circuit boards 43, 44 which are configured by the MCU, a control board, the high-voltage power supply circuit, and the like are placed outside the exhaust duct 47, the suction duct 48, and the exhaust duct 49. In the image forming apparatus, as shown in FIG. 12, therefore, an opening (gap) 62 which extends in the depth and height directions is formed between the first to fifth control boards 54, 55, 57, 59, 61, particularly the control boards 54, 55, 57 which are located in an upper portion of the apparatus main unit 1, and the metal-made boxes 45, 46 which are placed on the back face side (the outside of the apparatus main unit 1), and which house the first and second electric circuit boards 43, 44, with a degree corresponding to the placement of the exhaust duct 47, the suction duct 48, and the exhaust duct 49 on the back face side of the first to fifth control boards 54, 55, 57, 59, 61.

As a result, the metal-made boxes 45, 46 which house the first and second electric circuit boards 43, 44 are placed with being separated from the back sides of the first to fifth control boards 54, 55, 57, 59, 61. Therefore, the metal-made boxes 45, 46 basically exert a function of shielding the internal first to fifth control boards 54, 55, 57, 59, 61 from the influence of externally generated electromagnetic wave noise. However, the formation of the opening (gap) 62 between the control boards 54, 55, 57, 59, 61 and the metal-made boxes 45, 46 which are placed on the back face side of the control boards causes externally generated electromagnetic wave noise to easily enter the interior of the apparatus main unit 1 through the opening 62, thereby producing the possibility that the first to fifth control boards 54, 55, 57, 59, 61, particularly the first to third control boards 54, 55, 57 which are located in the upper portion malfunction.

In order to avoid the possibility that externally generated electromagnetic wave noise causes the control boards 54, 55, 57, 59, 61 to malfunction, it may be contemplated that a conductor which crosses the opening 62 existing between the control boards 54, 55, 57, 59, 61 and the metal-made boxes 45, 46 is disposed in a state where the conductor is protruded from the side of the apparatus main unit 1.

Figure 12:
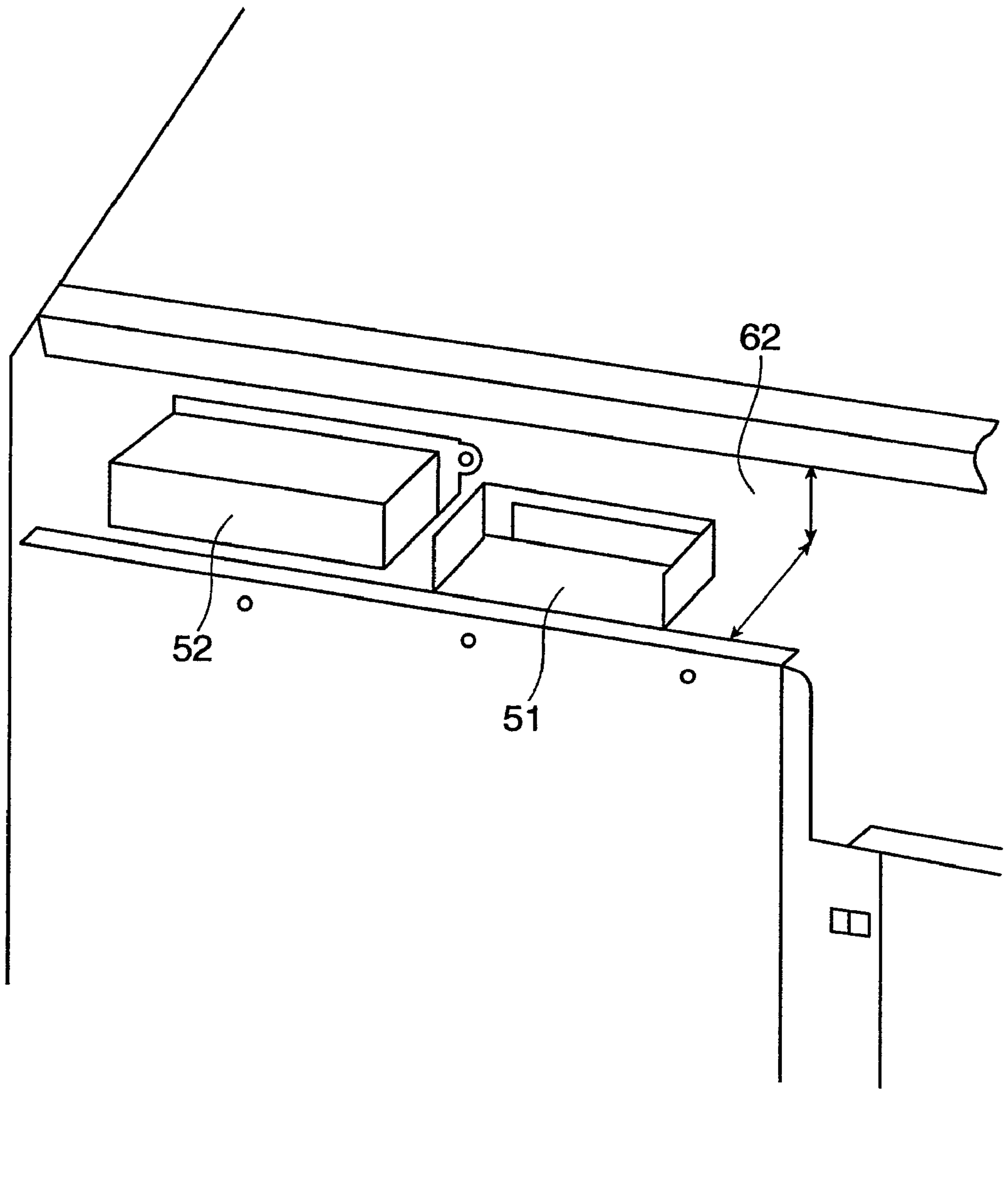
FIG. 12 is a view showing an opening.

In the case where the conductor crossing the opening 62 is disposed in the state where it is protruded from the side of the apparatus main unit 1, however, a space for attaching the grounding conductor is narrow because the exhaust duct 47, the suction duct 48, the exhaust duct 49, and the exhaust ports 51, 52 are placed on the rear face side of the apparatus main unit 1 as shown in FIGS. 7 and 12. As a result, it is difficult to attach a grounding conductor which extends from the metal-made boxes 45, 46 to the main frame.

Figure 1:
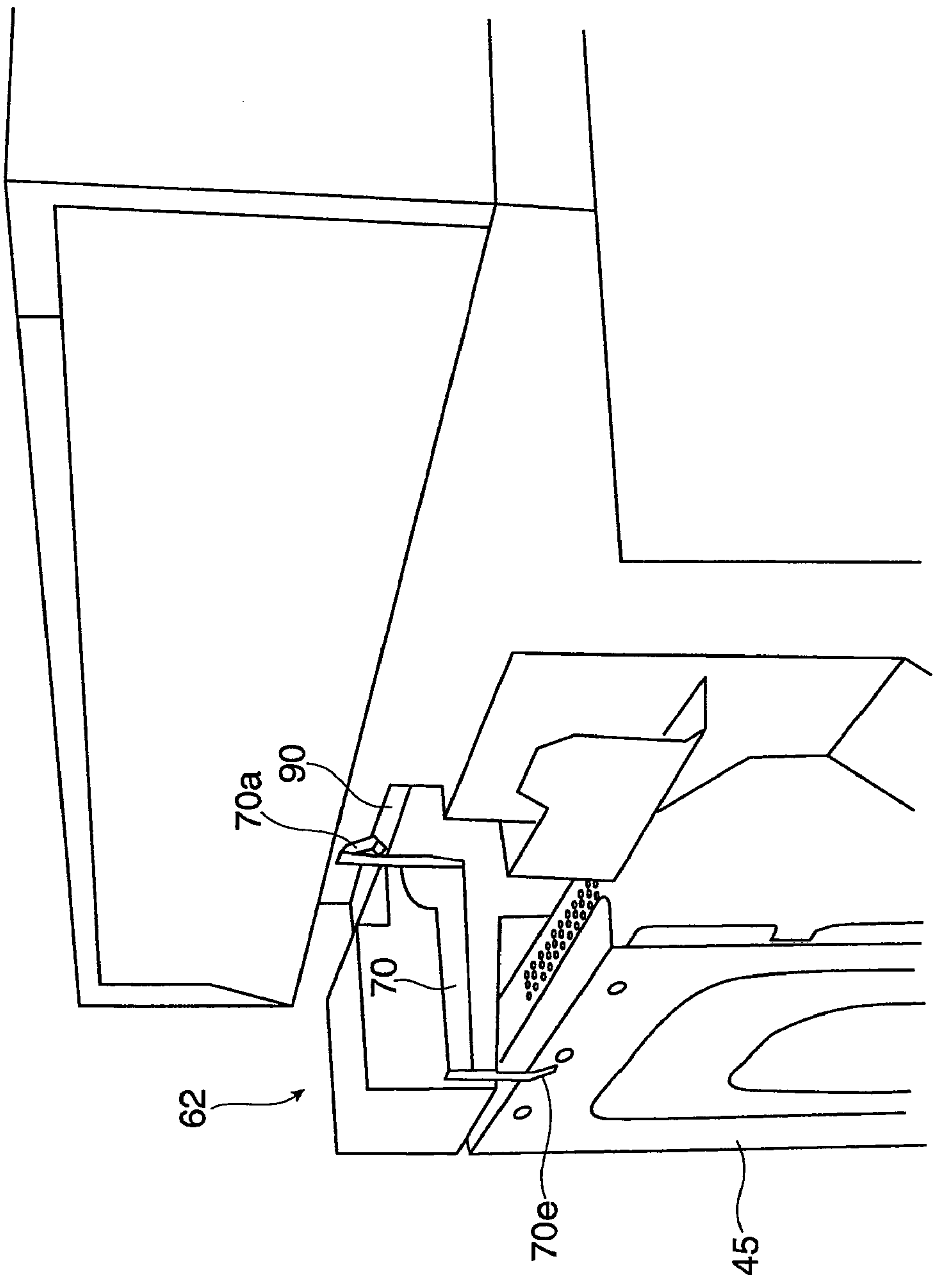
FIG. 1 is an exploded perspective view showing main portions of an image forming apparatus which is an apparatus of Exemplary embodiment 1 of the invention.

As shown in FIG. 1, therefore, the exemplary embodiment includes a plate spring member 70 which functions as an electrically conductive member, and which is fixed to the insides of the back covers 41, 42 so as to cross the opening 62 existing between the control boards 54, 55, 57, 59, 61 and the metal-made boxes 45, 46. One end portion of the plate spring member is connected to the metal-made boxes 45, 46 which function as a shielding conductor, and the other end portion is connected to the grounded main frame of the apparatus main unit 1.

Figure 10:
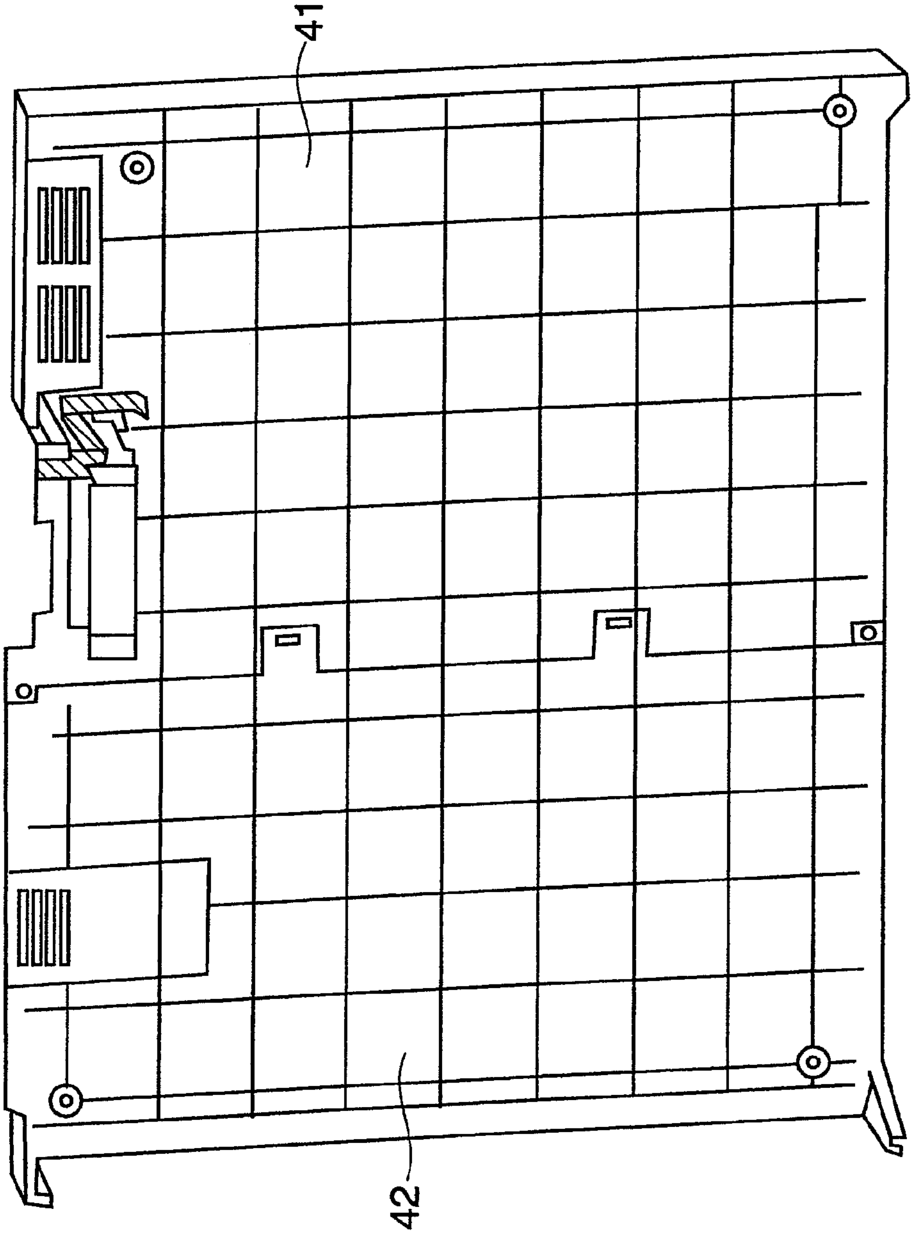
FIG. 10 is a view showing the inner faces of the back covers.
Figure 11:
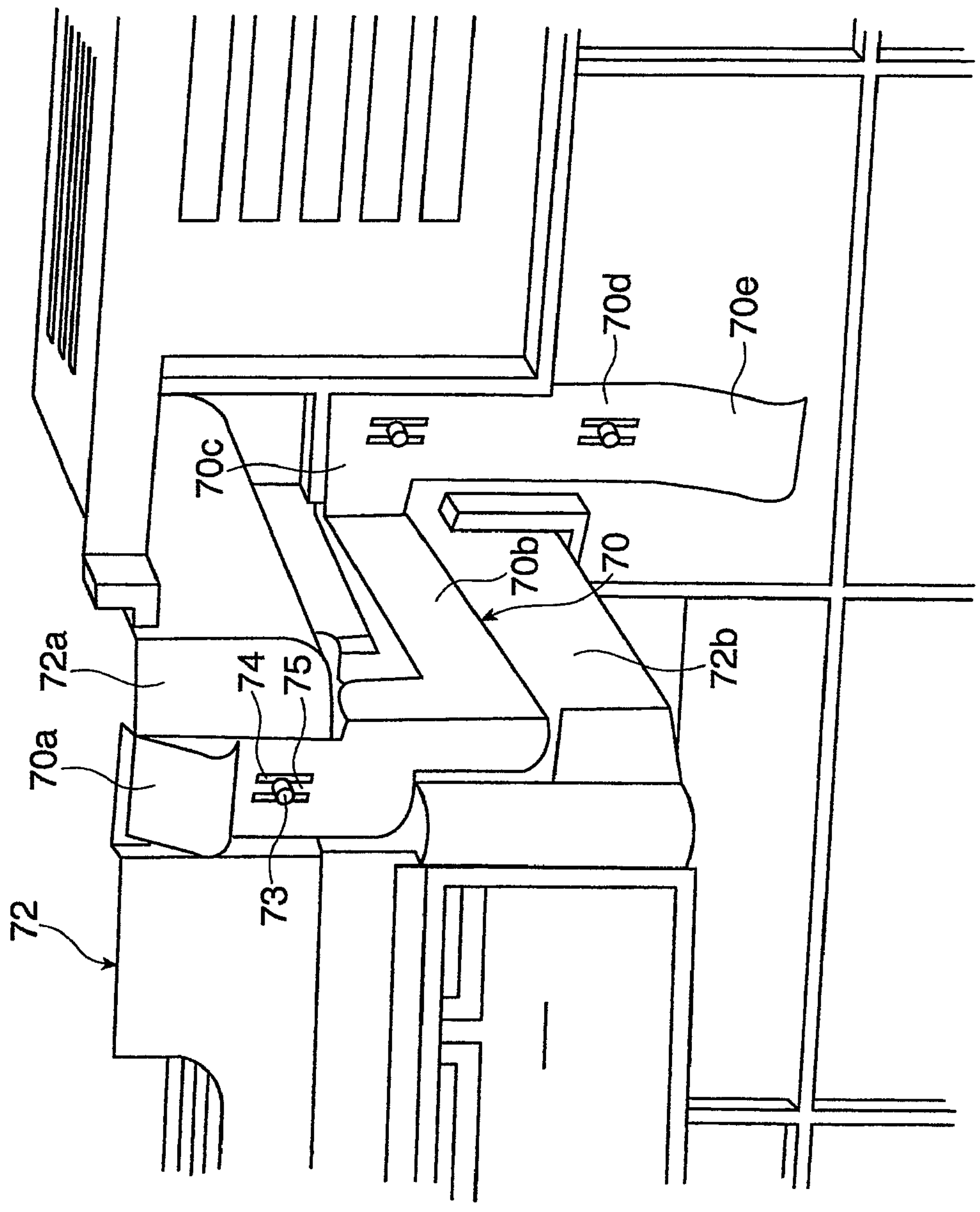
FIG. 11 is a view showing main portions of the inner faces of the back covers.

As shown in FIG. 10, the plate spring member 70 is attached in a fixed state to a position which is on the inner face side of the back cover 41, and which corresponds to the exhaust port 51 of the suction duct 48. As shown in FIG. 11, the plate spring member 70 is formed by a plate member which is made of, for example, a metal such as stainless steel, aluminum, or iron, and which has a spring property.

On the inner face side of the back cover 41, as shown in FIG. 11, an exhaust port forming member 72 which constitutes a part of the exhaust port 51 of the suction duct 48 is integrally formed in a state where the member is elongated toward the interior of the apparatus main unit 1, and the plate spring member 70 is placed along the exhaust port forming member 72. A rear end portion 70*a* of the plate spring member 70 is folded back toward the interior of the apparatus main unit 1. A front side of a folded portion is pressingly fixed to a rear end face 72*a* of the exhaust port forming member 72 while columnar projections 73 which are projectedly formed on the end face 72*a* are sandwiched between tongue pieces 75 which are formed by incisions 74 that are formed into a substantially H-like shape.

A portion of the plate spring member 70 on the side of the rear end portion 70*a* is placed in a state where the portion downward extends along the rear end face 72*a* of the exhaust port forming member 72. The plate spring member has: a portion 70*b* which extends toward the outside of the apparatus main unit 1 along a side face 72*b* of the exhaust port forming member 72; a portion 70*c* which is folded back from the portion 70*b* laterally and shortly along the inner face of the outer edge of the back cover 41; and a portion 70*d* which downward extends from the portion 70*c*. An outer edge 70*e* of the plate spring member 70 which is positioned in the lower end of the portion 70*d* is bent in a direction (inward) in which the lower end is separated from the inner face of the back cover 41.

As shown in FIG. 1, the rear end portion 70*a* of the plate spring member 70 is pressingly contacted with a frame 90 of the image reading apparatus 2 which functions as the main frame of the apparatus main unit 1, in a state where the back cover 41 is attached to a predetermined position of the apparatus main unit 1. The frame 90 of the image reading apparatus 2 is connected to the main frame to be grounded through the main frame which is connected to the ground.

As shown in FIG. 1, the front (outer) edge 70*e* of the plate spring member 70 is pressingly contacted with the outer face located in an upper end portion of the metal-made box 45. As a result, the opening 62 which exists between the control boards 54, 55, 57, 59, 61 and the metal-made boxes 45, 46 is divided into two sections by the plate spring member 70 which is placed so as to cross the opening 62, and the opening area of the opening 62 is largely reduced.

Experimental Example

The inventor produces a prototype of the image forming apparatus which is the apparatus of the above-described exemplary embodiment, and conducts experiments for checking the influence of electromagnetic wave noise in accordance with IEC 6100-4-3.

In a frequency range of 80 MHz to 1 GHZ, the intensity of electromagnetic wave noise which is AM modulated by a sinusoidal wave of 1 kHz is changed, and it is checked whether abnormality occurs in the operation of the image forming apparatus or not. The irradiation of the noise is performed while the noise source is separated by 3 m from the back and upper faces of the apparatus main unit 1.

FIG. 13 shows results of the experimental example.

As seen from FIG. 13, it is noted that, at any of 3 V/m, 4 V/m, 5 V/m, and 6 V/m, a malfunction occurs, but, in the case where the countermeasure according to the exemplary embodiment is taken, at any of 3 V/m, 4 V/m, 5 V/m, and 6 V/m, a malfunction does not occur, and the image forming apparatus normally operates.

Exemplary Embodiment 2

Figure 14:
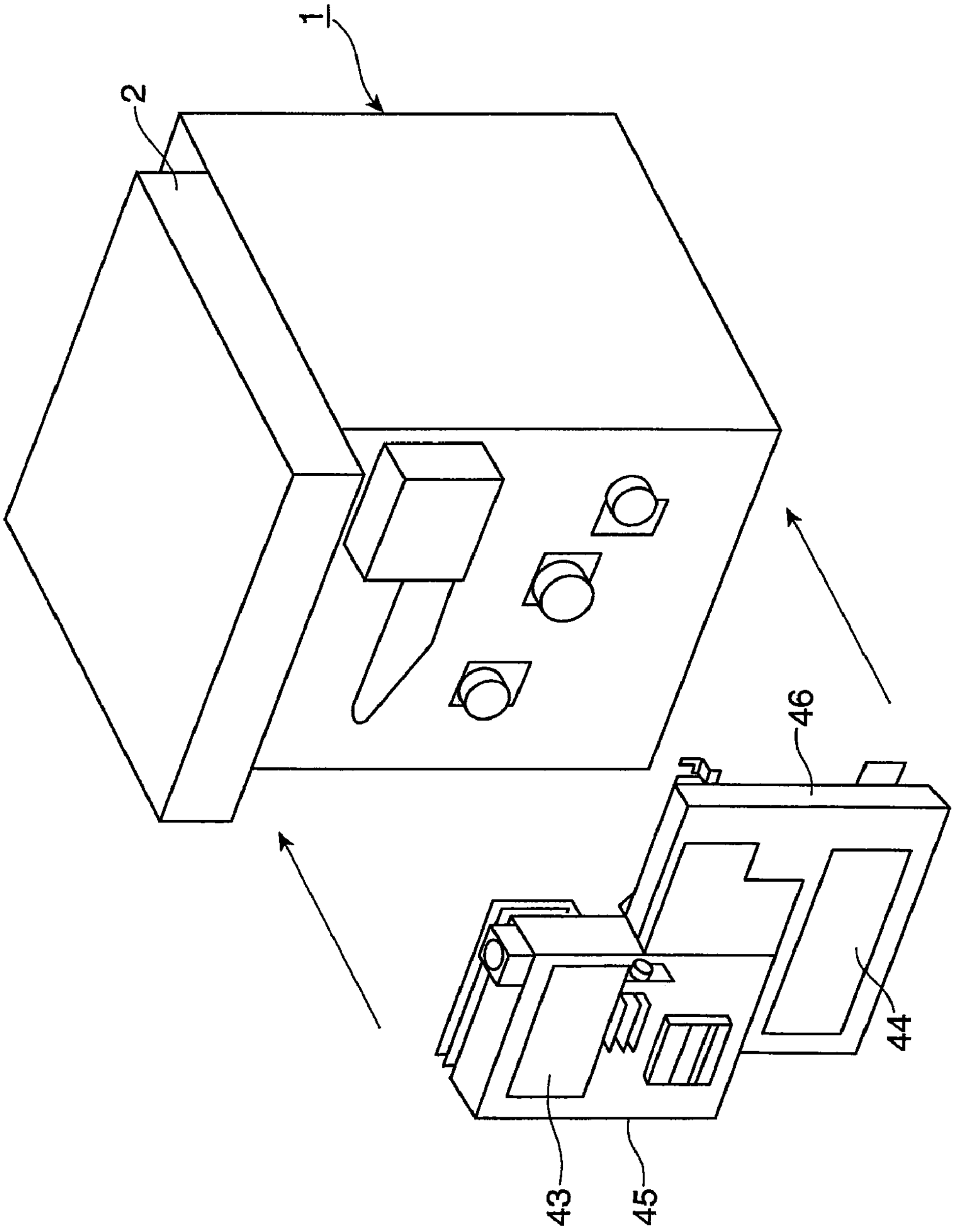
FIG. 14 is an exploded perspective view showing main portions of an image forming apparatus which is an apparatus of Exemplary embodiment 2 of the invention.
Figure 15:
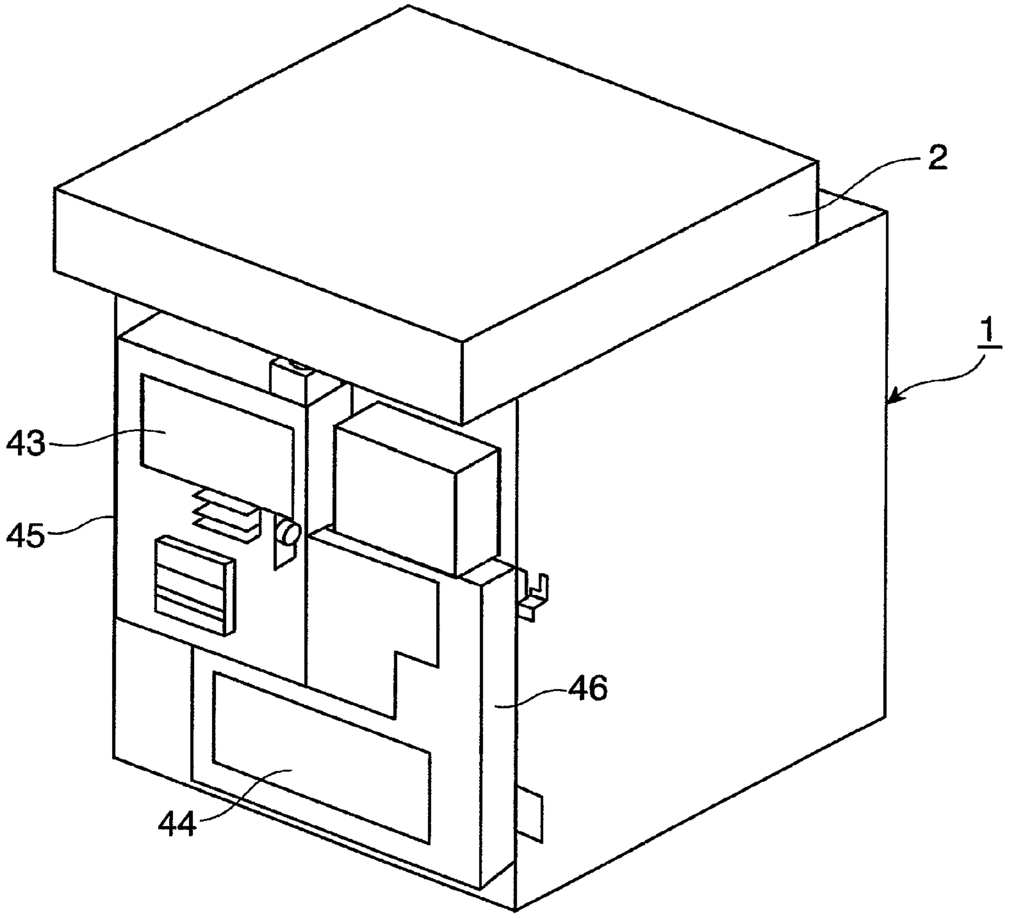
FIG. 15 is an exploded perspective view showing main portions of the image forming apparatus which is the apparatus of Exemplary embodiment 2 of the invention.

FIGS. 14 and 15 show Exemplary embodiment 2 of the invention. The description is made while parts identical to those of Exemplary embodiment 1 described above are denoted by the same reference numerals. In Exemplary embodiment 2, the structure of attaching the shielding conductor is different from that of Exemplary embodiment 1.

In Exemplary embodiment 2, as shown in FIGS. 14 and 15, the metal-made boxes 45, 46 which house the first and second electric circuit boards 43, 44 are not openably attached to the apparatus main unit 1, but detachably attached to the apparatus main unit 1 by screws (not shown) or the like.

The other configuration and function are identical with those of Exemplary embodiment 1, and hence their description is omitted.

The foregoing description of the embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention defined by the following claims and their equivalents.

What is claimed is:

1. An apparatus comprising:

a circuit board which is disposed at a main unit frame of the apparatus;

a shielding conductor which is placed outside the circuit board;

a covering member which is placed outside the shielding conductor and covers an outer side face of the apparatus; and an electrically conductive member which is fixed to an inside of the covering member to cross the circuit board and an opening which exists between the main unit frame and the shielding conductor, one end portion of the electrically conductive member being connected to the shielding conductor, another end portion of the electrically conductive member being connected to a grounded frame of the apparatus, wherein the electrically conductive member is disposed to cross both the circuit board and the opening extending in a direction substantially orthogonal to a surface of the main unit frame on which the circuit board is disposed.

2. The apparatus according to claim 1, wherein the electrically conductive member is configured by a plate spring which is disposed on an inner side face of the covering member.

* * * * *